United States Patent
Stamper et al.

(10) Patent No.: US 10,903,316 B2
(45) Date of Patent: Jan. 26, 2021

(54) RADIO FREQUENCY SWITCHES WITH AIR GAP STRUCTURES

(71) Applicant: GLOBALFOUNDRIES INC., Grand Cayman (KY)

(72) Inventors: Anthony K. Stamper, Burlington, VT (US); Steven M. Shank, Jericho, VT (US); John J. Ellis-Monaghan, Grand Isle, VT (US); Siva P. Adusumilli, Burlington, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/575,675

(22) Filed: Sep. 19, 2019

(65) Prior Publication Data

US 2020/0013855 A1    Jan. 9, 2020

Related U.S. Application Data

(62) Division of application No. 15/645,655, filed on Jul. 10, 2017, now Pat. No. 10,461,152.

(51) Int. Cl.
| | |
|---|---|
| *H01L 21/764* | (2006.01) |
| *H01L 29/06* | (2006.01) |
| *H01L 23/66* | (2006.01) |
| *H01L 29/10* | (2006.01) |
| *H01L 29/78* | (2006.01) |
| *H01L 21/762* | (2006.01) |

(52) U.S. Cl.
CPC ........ *H01L 29/0649* (2013.01); *H01L 21/764* (2013.01); *H01L 23/66* (2013.01); *H01L 29/0653* (2013.01); *H01L 29/1083* (2013.01); *H01L 29/78* (2013.01); *H01L 21/76264* (2013.01); *H01L 21/76283* (2013.01)

(58) Field of Classification Search
CPC ................. H01L 23/66; H01L 29/1083; H01L 21/764–765; H01L 29/0653; H01L 29/78; H01L 21/76264; H01L 21/76283; H01L 29/0649–0653
See application file for complete search history.

(56) References Cited

U.S. PATENT DOCUMENTS

| | | | |
|---|---|---|---|
| 4,710,794 A | 12/1987 | Koshino et al. | |
| 4,888,300 A | 12/1989 | Burton | |

(Continued)

FOREIGN PATENT DOCUMENTS

| | | |
|---|---|---|
| JP | 2009099841 | 5/2009 |
| TW | 201711190 | 3/2017 |

OTHER PUBLICATIONS

Office Action in U.S. Appl. No. 15/703,220 dated Oct. 18, 2019, 18 pages.

(Continued)

*Primary Examiner* — Jarrett J Stark
(74) *Attorney, Agent, or Firm* — Anthony Canale; Andrew M. Calderon; Robests Calderon Safran & Cole, P.C.

(57) ABSTRACT

The present disclosure relates to semiconductor structures and, more particularly, to radio frequency (RF) switches with airgap structures and methods of manufacture. The structure includes a substrate with at least one airgap structure formed in a well region under at least one gate structure, and which extends to a junction formed by a source/drain region of the at least one gate structure.

20 Claims, 7 Drawing Sheets

US 10,903,316 B2

Page 2

(56) References Cited

U.S. PATENT DOCUMENTS

| | | | |
|---|---|---|---|
| 5,427,975 A | 6/1995 | Sparks et al. | |
| 5,844,299 A | 12/1998 | Merill et al. | |
| 5,869,374 A * | 2/1999 | Wu | H01L 21/28114 |
| | | | 257/E21.205 |
| 5,943,581 A | 8/1999 | Lu et al. | |
| 5,949,144 A | 9/1999 | Delgado et al. | |
| 5,972,758 A * | 10/1999 | Liang | H01L 21/762 |
| | | | 257/E21.433 |
| 6,093,330 A | 7/2000 | Chong et al. | |
| 6,093,599 A | 7/2000 | Lee et al. | |
| 6,057,202 A | 9/2000 | Chen et al. | |
| 6,140,197 A | 10/2000 | Chu et al. | |
| 6,255,704 B1 | 7/2001 | Iwata et al. | |
| 6,258,688 B1 | 7/2001 | Tsai | |
| 6,274,920 B1 | 8/2001 | Park et al. | |
| 6,307,247 B1 | 10/2001 | Davies | |
| 6,337,499 B1 | 1/2002 | Werner | |
| 6,376,291 B1 | 4/2002 | Barlocchi et al. | |
| 6,518,144 B2 | 2/2003 | Nitta et al. | |
| 6,518,147 B1 | 2/2003 | Villa et al. | |
| 6,551,944 B1 | 4/2003 | Fallica et al. | |
| 6,570,217 B1 | 5/2003 | Sato et al. | |
| 6,670,257 B1 | 12/2003 | Barlocchi et al. | |
| 6,720,229 B2 | 4/2004 | Norström et al. | |
| 6,833,079 B1 | 12/2004 | Giordani | |
| 6,835,631 B1 | 12/2004 | Zhen et al. | |
| 6,928,879 B2 | 8/2005 | Partridge et al. | |
| 6,992,367 B2 | 1/2006 | Erratico et al. | |
| 7,009,273 B2 | 3/2006 | Inoh et al. | |
| 7,053,747 B2 | 5/2006 | Joodaki | |
| 7,279,377 B2 | 10/2007 | Rueger et al. | |
| 7,294,536 B2 | 11/2007 | Villa et al. | |
| 7,326,625 B2 | 2/2008 | Jeong et al. | |
| 7,354,786 B2 | 4/2008 | Benzel et al. | |
| 7,427,803 B2 | 9/2008 | Chao et al. | |
| 7,662,722 B2 | 2/2010 | Stamper et al. | |
| 7,678,600 B2 | 3/2010 | Villa et al. | |
| 7,906,388 B2 | 3/2011 | Sonsky | |
| 8,203,137 B2 | 6/2012 | Cho et al. | |
| 8,319,278 B1 | 11/2012 | Zeng et al. | |
| 8,575,690 B1 | 11/2013 | Hsieh | |
| 8,652,951 B2 | 2/2014 | Huang et al. | |
| 8,674,472 B2 | 3/2014 | Botula et al. | |
| 8,907,408 B2 | 12/2014 | Sedlmaier et al. | |
| 8,927,386 B2 | 1/2015 | Wu et al. | |
| 9,029,229 B2 | 5/2015 | Adkisson et al. | |
| 9,048,284 B2 | 6/2015 | McPartlin et al. | |
| 9,059,252 B1 | 6/2015 | Liu et al. | |
| 9,159,817 B2 | 10/2015 | Camillo-Castillo et al. | |
| 9,177,866 B2 | 11/2015 | Davies | |
| 9,224,858 B1 | 12/2015 | Camillo-Castillo et al. | |
| 9,324,846 B1 | 4/2016 | Camillo-Castillo et al. | |
| 9,349,793 B2 | 5/2016 | Jaffe et al. | |
| 9,355,972 B2 | 5/2016 | Dunn et al. | |
| 9,570,564 B2 | 2/2017 | Alperstein et al. | |
| 9,640,538 B2 | 5/2017 | Liu et al. | |
| 9,711,392 B2 | 7/2017 | Dehe et al. | |
| 9,722,057 B2 | 8/2017 | Camillo-Castillo et al. | |
| 9,726,547 B2 | 8/2017 | Liu et al. | |
| 9,917,186 B2 | 3/2018 | Laven et al. | |
| 9,922,973 B1 | 3/2018 | Shank et al. | |
| 10,062,757 B2 | 8/2018 | Toia et al. | |
| 10,109,490 B1 | 10/2018 | Lin et al. | |
| 10,446,643 B2 | 10/2019 | Adusumilli et al. | |
| 10,461,152 B2 | 10/2019 | Stamper et al. | |
| 2002/0043686 A1 | 4/2002 | Bolam et al. | |
| 2002/0195681 A1 | 12/2002 | Melendez et al. | |
| 2003/0067014 A1 | 4/2003 | Tsuruta et al. | |
| 2004/0180510 A1 | 9/2004 | Ranade et al. | |
| 2004/0217434 A1 | 11/2004 | Lee et al. | |
| 2004/0217443 A1 | 11/2004 | Davies | |
| 2005/0176222 A1 * | 8/2005 | Ogura | H01L 21/3247 |
| | | | 438/514 |
| 2006/0091453 A1 | 5/2006 | Matsuda et al. | |
| 2006/0138541 A1 | 6/2006 | Nakamura et al. | |
| 2006/0214258 A1 | 9/2006 | Kiyotoshi | |
| 2006/0228864 A1 | 10/2006 | Chen et al. | |
| 2007/0181920 A1 | 8/2007 | Renna et al. | |
| 2007/0238250 A1 | 10/2007 | Zhang et al. | |
| 2008/0044979 A1 | 2/2008 | Wells et al. | |
| 2008/0073747 A1 | 3/2008 | Chao et al. | |
| 2009/0072351 A1 | 3/2009 | Meunier-Beillard et al. | |
| 2009/0101997 A1 | 4/2009 | Lammel et al. | |
| 2009/0127648 A1 | 5/2009 | Chen et al. | |
| 2009/0191687 A1 | 7/2009 | Hong et al. | |
| 2010/0035403 A1 * | 2/2010 | Brown | H01L 27/12 |
| | | | 438/422 |
| 2010/0059854 A1 * | 3/2010 | Lin | H01L 25/50 |
| | | | 257/528 |
| 2010/0109120 A1 * | 5/2010 | Fucsko | H01L 21/30608 |
| | | | 257/507 |
| 2010/0117136 A1 * | 5/2010 | Yasuda | H01L 29/40117 |
| | | | 257/321 |
| 2012/0028401 A1 * | 2/2012 | De Munck | H01L 27/1463 |
| | | | 438/73 |
| 2012/0038024 A1 * | 2/2012 | Botula | H01L 27/1203 |
| | | | 257/510 |
| 2012/0211805 A1 | 8/2012 | Winkler et al. | |
| 2012/0292700 A1 * | 11/2012 | Khakifirooz | H01L 21/84 |
| | | | 257/347 |
| 2013/0043490 A1 | 2/2013 | Sorada | |
| 2013/0320459 A1 | 12/2013 | Shue et al. | |
| 2014/0042595 A1 | 2/2014 | Schulze et al. | |
| 2014/0097402 A1 | 4/2014 | Wang et al. | |
| 2014/0151852 A1 | 6/2014 | Adkisson et al. | |
| 2014/0252481 A1 * | 9/2014 | Flachowsky | H01L 29/66742 |
| | | | 257/349 |
| 2014/0353725 A1 | 12/2014 | Adkisson et al. | |
| 2015/0179755 A1 * | 6/2015 | Rooyackers | H01L 29/6681 |
| | | | 257/24 |
| 2015/0179791 A1 | 6/2015 | Kudou | |
| 2015/0194416 A1 | 7/2015 | Cheng et al. | |
| 2015/0318665 A1 | 11/2015 | Liang | |
| 2015/0348825 A1 * | 12/2015 | Hebert | H01L 21/76283 |
| | | | 257/522 |
| 2016/0372592 A1 | 12/2016 | Cho | |
| 2017/0110574 A1 | 4/2017 | LaVen et al. | |
| 2017/0117224 A1 | 4/2017 | Adusumilli et al. | |
| 2017/0170056 A1 * | 6/2017 | Jaffe | H01L 21/26533 |
| 2018/0083098 A1 | 3/2018 | Goktepeli | |
| 2019/0013382 A1 * | 1/2019 | Stamper | H01L 29/0653 |

OTHER PUBLICATIONS

Response to Office Action in U.S. Appl. No. 15/703,220 dated Jan. 17, 2020, 12 pages.
Hashimoto et al., "A Study on Suppressing Crosstalk Through a Thick SOI Substrate and Deep Trench Isolation", IEEE, Jul. 2013, vol. 1, No. 7, 7 pages.
Ohguro et al., "High performance digital-analog mixed device on a Si substrate with resistivity beyond 1 kΩ cm", IEEE, 2000, 4 pages.
Taiwanese Office Action in related U.S. Appl. No. 106132441 dated Jul. 16, 2018, 10 pages.
Taiwanese Office Action in related U.S. Appl. No. 107112403 dated Oct. 18, 2018, 9 pages.
Taiwanese Office Action and Search Report in related TW Application No. 106132441 dated Dec. 7, 2018, 14 pages.
Taiwanese Office Action in TW Application No. 106132441 dated Jun. 4, 2019, 10 pages.
Notice of Allowance in TW Application No. 107112403 dated Mar. 27, 2019, 4 pages.
Final Office Action in U.S. Appl. No. 15/703,220 dated Mar. 16, 2020, 21 pages.
Response to Final Office Action in U.S. Appl. No. 15/703,220 dated Apr. 20, 2020, 16 pages.
Taiwanese Office Action and Search Report in related TW Application No. 106132441 dated Mar. 3, 2020, 10 pages.
Office Action in U.S. Appl. No. 16/241,441 dated May 12, 2020, 8 pages.
DE Office Action in DE Application No. 102018222690.3 dated May 28, 2020, 9 pages.

(56) References Cited

OTHER PUBLICATIONS

Notice of Allowance in U.S. Appl. No. 15/703,220 dated Jun. 15, 2020, 8 pages.
Office Action in U.S. Appl. No. 16/538,062 dated Oct. 6, 2020, 7 pages.
Office Action in U.S. Appl. No. 16/206,375 dated Oct. 19, 2020, 12 pages.
Taiwanese Office Action in TW Application No. 108139071 dated Aug. 21, 2020, 9 pages.
Response to Office Action in U.S. Appl. No. 16/241,441, filed Aug. 12, 2020, 11 pages.
Taiwanese Notice of Allowance in TW Application No. 106132441 dated Sep. 8, 2020, 4 pages.

\* cited by examiner

US 10,903,316 B2

RADIO FREQUENCY SWITCHES WITH AIR GAP STRUCTURES

FIELD OF THE INVENTION

The present disclosure relates to semiconductor structures and, more particularly, to radio frequency (RF) switches with airgap structures and methods of manufacture.

BACKGROUND

Radio frequency (RF) devices are used in many different types of communication applications. For example, RF devices can be used in cellular telephones with wireless communication components such as switches, MOSFETs, transistors and diodes.

As cellular telephones become more complex and commoditized, there is an increasing need to provide higher performance and lower price points for the wireless communication components. A significant fraction of the cost of manufacturing an RF switch, for example, is the cost to engineer very high linearity such that harmonic distortion is extremely low and meets product specifications.

RF devices are typically manufactured on high resistivity silicon wafers or substrates to achieve the needed rf linearity. State-of-the-art trap rich silicon on insulator (SOI) high resistivity substrates offer excellent vertical isolation and linearity, but the SOI wafer can be up to 50% of the total manufacturing cost because they can be 5 to 10 times the cost of high resistivity non-SOI substrates, i.e., a rf device formed on a SOI wafer could have a total normalized manufacturing cost of 1.0 while a similar device formed on a high resistivity non-SOI bulk wafer could have a total normalized manufacturing cost of 0.6. Devices built on bulk Si substrates have been known to suffer from degraded linearity, harmonics, noise, and leakage currents, any of which will degrade device performance thus necessitating the higher cost of SOI wafers.

SUMMARY

In an aspect of the disclosure, a structure comprises a substrate with at least one airgap structure formed in a well region under at least one gate structure, and which extends to a junction formed by a source/drain region of the at least one gate structure.

In an aspect of the disclosure, a structure comprises: a substrate with at least one well region; at least one gate structure located above the at least one well region; a plurality of trenches extending into the at least one well region; and at least one airgap structure extending from the plurality of trenches, under source/drain regions of the at least one gate structure and in the at least one well region.

In an aspect of the disclosure, a method comprises: forming a plurality of trenches into a well region of a substrate; lining the plurality of trenches with insulator material; and forming at least one airgap structure extending from the plurality of trenches within the well region by etching the high resistivity substrate through the plurality of trenches.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to radio frequency (RF) FETs or NPNs, such as FET switches, with airgap structures formed in the substrate under the switches. More specifically, the present disclosure relates to radio frequency (RF) switches formed using FETs with airgap structures under the FET source/drain used in front end module transceivers. In embodiments, the structures can further include local SOI and deep trench isolation structures, amongst other features. Advantageously, the airgap structures between gate structures will improve the rf parameters, such as linearity and insertion loss, of the device.

In embodiments, airgap structures can be formed in bulk high resistivity silicon wafers, e.g., a resistivity >>1 ohm-cm or about 1 Kohm-cm to about 10 Kohm-cm or higher. In embodiments, the airgap structures are formed under the source/drain regions extending to a bottom of a PN junction under gate structures. In further embodiments, the airgap structures can be formed with a dual well stack with deep trench isolation structures to avoid depletion region punch through, or in a triple well structure without deep trench isolation structures. In additional embodiments, the airgap structures can be oxidized to merge into each other; or individual airgaps can be merged into larger airgaps. Contacts and wires are formed over the airgap structures to provide a FET source/drain voltage bias and/or rf signal path, for example.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii)

applying a patterned mask on top of the films by photolithographic imaging, and (iii) etching the films selectively to the mask.

Figure 1A:
FIGS. 1A-1C show incoming structures and respective fabrication processes in accordance with aspects of the present disclosure.

FIG. 1A shows an incoming structure in accordance with aspects of the present disclosure. In particular, the structure 10 includes a substrate 12 which can be a high resistivity substrate in the range of about between 1 Kohm-cm to 10 Kohm-cm, as an illustrative example. It should be recognized that resistivities of 1K ohm-cm and greater are sufficient to significantly reduce substrate induced harmonic distortion and losses. Higher resistivities, though, are also contemplated up to 20 Kohm-cm. In embodiments, the substrate 12 can be composed of any suitable semiconductor materials such as, e.g., Si, SiGe, SiGeC, SiC, GaAs, InAs, InP, and other III/V or II/VI compound semiconductors.

Still referring to FIG. 1A, an optional alignment mark 13 is patterned and etched into the substrate 12. This optional alignment mark is used for aligning subsequent lithography levels. Next, one or more pad dielectric films 15, such as but not limited to 10 nm of thermal oxide and 100 nm of CVD nitride, are deposited on the substrate 12.

Figure 1B:
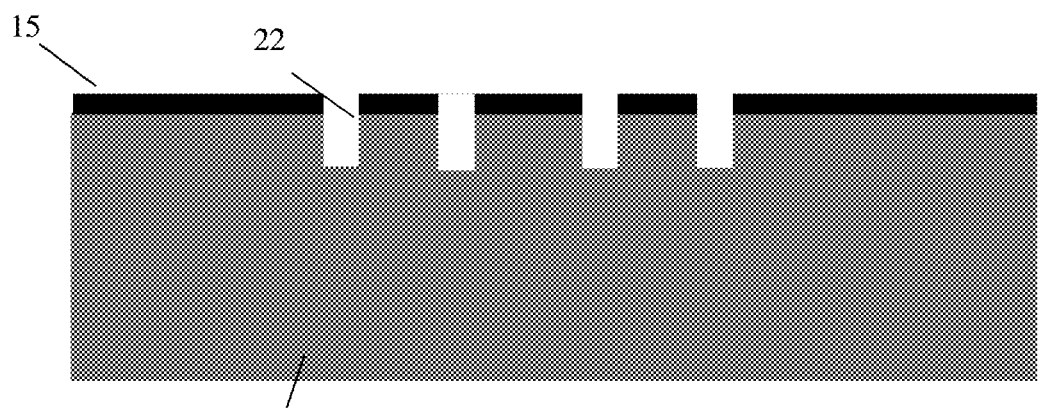

Referring to FIG. 1B, openings or trenches 22 are patterned on the pad dielectric films 15, the dielectrics 15 are etched, and trenches 22 are etched into the substrate 12. The width of the trenches 22 is determined by the lithography resolution and the to be etched depth. In one embodiment, the trenches are 120 nm wide and 0.7 micron deep.

Figure 1C:
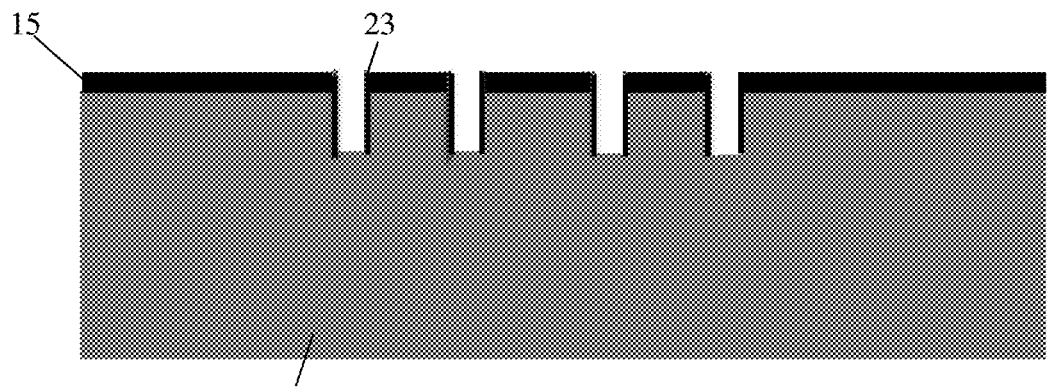

Referring to FIG. 1C, a spacer dielectric 23 is formed on the sidewalls of the trenches 22 by depositing a dielectric and anisotropically etching the spacer dielectric 13 from the bottom and top planar feature. The anisotropic etch could consist of a reactive ion etch (RIE) using a perfluorocarbon-based chemistry, as is known in the art, which etches material from planar surfaces but forms dielectrics on sidewalls and leaves the dielectric on the sidewall. These type of spacer etches are commonly used on MOSFET poly gates to allow for ion implants spaced away from the poly gate.

Following trench formation, the trenches 22 are lined with an insulative material (also referred to as liner or spacer) 23. In embodiments, the liner 23 is one or more of any suitable dielectric materials such as one or more oxide or nitride layers deposited using any known deposition method, e.g., chemical vapor deposition (CVD), thermal oxidization of the silicon substrate, or atomic layer deposition (ALD). The spacer 23 needs to robustly coat the sidewalls of the trenches 22. To achieve this robust sidewall coverage, the spacer film needs to be thick enough to leave a thick film on the sidewalls of the trenches 22 but not too thick that it pinches off the top opening of the trenches 22, which would prevent the spacer 23 from forming. In embodiments, the trenches 22 are 100 nm wide, and 40 nm of nitride is deposited, and the spacer 23 is anisotropically etched. In another embodiment, the sidewall of trenches 22 is thermally oxidized to form a $SiO_2$ layer which extends under the pad films 15. Following this thermal oxidization, either the spacer 23 is formed with the anisotropic etch or one or more films of, for example oxide or nitride, are deposited using CVD/ALD-type depositions before forming the spacer 23.

Figure 2A:
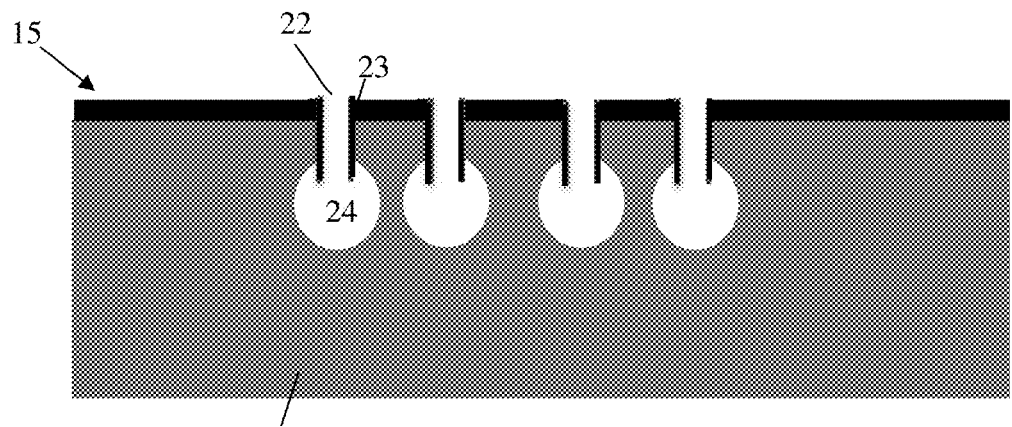
FIGS. 2A-2F show several different structures and respective fabrication processes in accordance with aspects of the present disclosure.

In embodiments using silicon substrates, airgap structures 24 in FIG. 2A are formed by a silicon etching process through the bottom of the trenches 22. In embodiments, an optional vapor or liquid HF treatment, hydrogen plasma, anneal, basic or acidic chemical clean, or any process known to remove thin or native dielectrics or residual spacer etch polymer from silicon can also be used to remove any excessive dielectric at a bottom of the trenches 22. These post spacer etch cleans should leave a robust dielectric liner on the top and sidewall of the trench 22 to prevent the subsequent silicon etch from etching silicon on the sidewall of the trench 22 or the top of the silicon wafer 12. Following the spacer formation and optional clean(s), exposed substrate material in the substrate 12 at the bottom of the trench 22 can be removed to form an airgap structure 24. In embodiments, the exposed substrate material in the substrate 12 can be removed by a wet etching process or dry etching process. For example, dry etchants can include plasma-based $CF_4$, plasma-based $SF_6$, or gas $XeF_4$ silicon etch, etc. and wet etching processes can included KOH and $NH_4OH$. In embodiments, the airgap structures 24 are formed under what will be the FET source/drain regions extending to a bottom of a PN junction under and between gate structures. For example, the upper surface of airgap structures 24 can be about 300 nm in depth; although other dimensions are also contemplated herein.

Figure 2B:
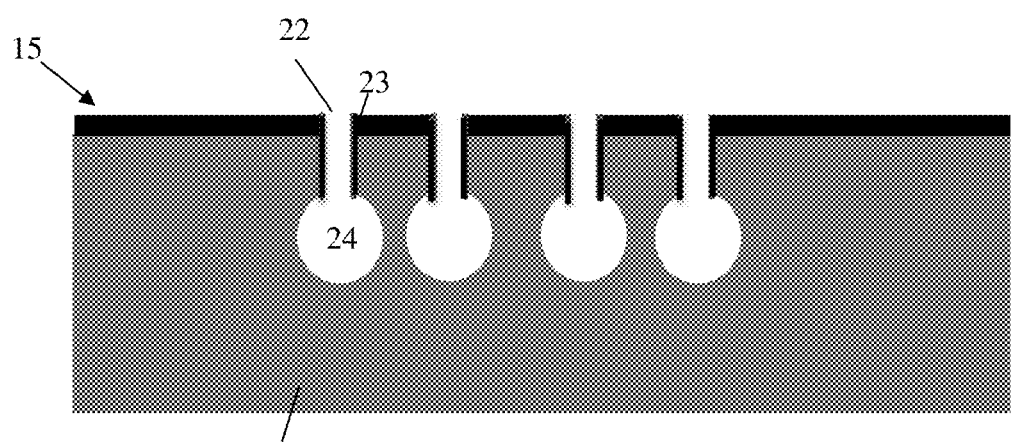
Figure 2B:
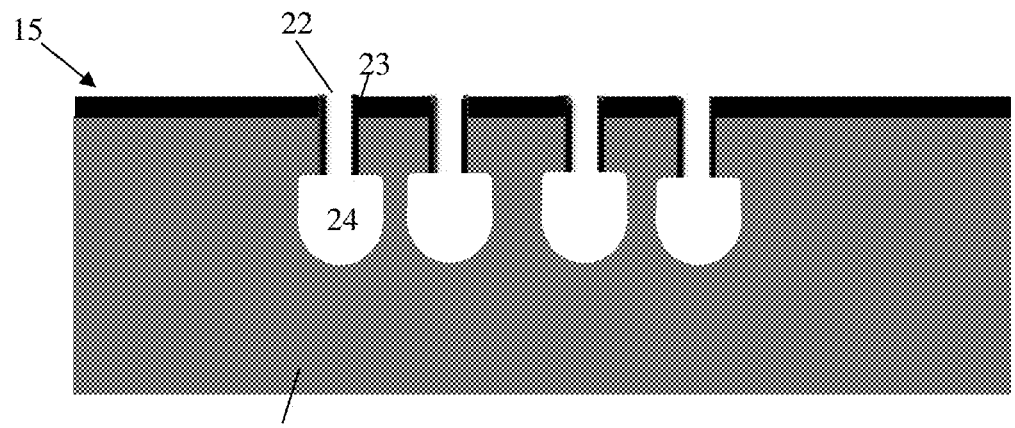

To avoid etching of silicon substrate not at the bottom of the trenches 22, it is important that the dielectric layers 15 and 23 completely cover the silicon to prevent unintentional silicon etching. FIGS. 2A and 2B show the airgap 24 formation such that the airgap extends above the bottom of the trench 22 and the spacer films 23 are exposed. FIGS. 2A and 2B show the exposed spacer films 23 as not changing their shape as they are exposed. The exposed spacer films 23 could curl due to their residual stress.

FIG. 2B shows an alternative embodiment in which the airgap 24 is formed under the trenches 22 and does not extend above the bottom of the trench 22. In this case, the spacer films 23 are not undercut.

FIG. 2B' shows an alternative embodiment in which the airgap 24 is formed with an anisotropic etch using, for example, a $SF_6$-based etch with vertically directional ion bombardment through the trench 22. This ion bombardment of what will be the bottom of the airgap allows the top of the airgap 24 to be less circular, which can improve its subsequent extension through the FET source/drain junction. The spacer could stop at the airgap 24 top, as shown in FIG. 2B or extend into the airgap, as shown in FIG. 2A.

Figure 2C:
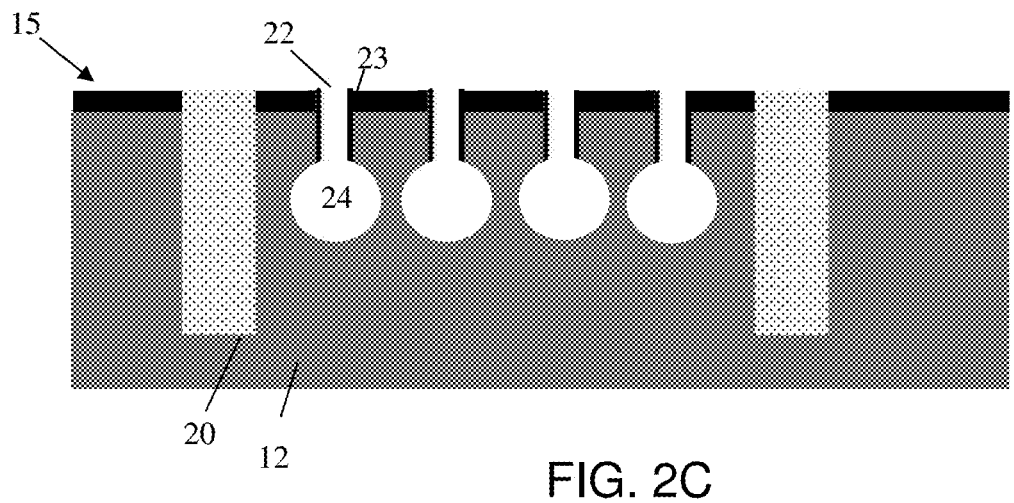

FIG. 2C shows deep trench structures 20 filled with a dielectric, such as oxide, or a dielectric liner and polysilicon, and airgap structures 24 in alignment with the trenches 22, amongst other features. These trenches are etched deep enough into the high resistivity substrate to extend beyond the maximum depletion depth of the pn junctions. Since deep trench structures 20 extend beyond the maximum junction depletion depth, they prevent adjacent doped wells in the silicon from shorting to each other. Specifically, as shown in FIG. 2C, deep trench isolation structures 20 are formed in the substrate 12. These deep trench isolation structures 20 are etched several 10's of microns into the substrate and filled with a dielectric, such as oxide, or a dielectric liner and polysilicon, using chemical mechanical polishing to remove excess material from the surface or other methods as known in the art. In embodiments, the (silicon wafer) substrate 12 has a resistivity of 3000 ohm-cm and the trench isolation 20 are etched 70 micron deep, to avoid depletion punch through.

Figure 5:
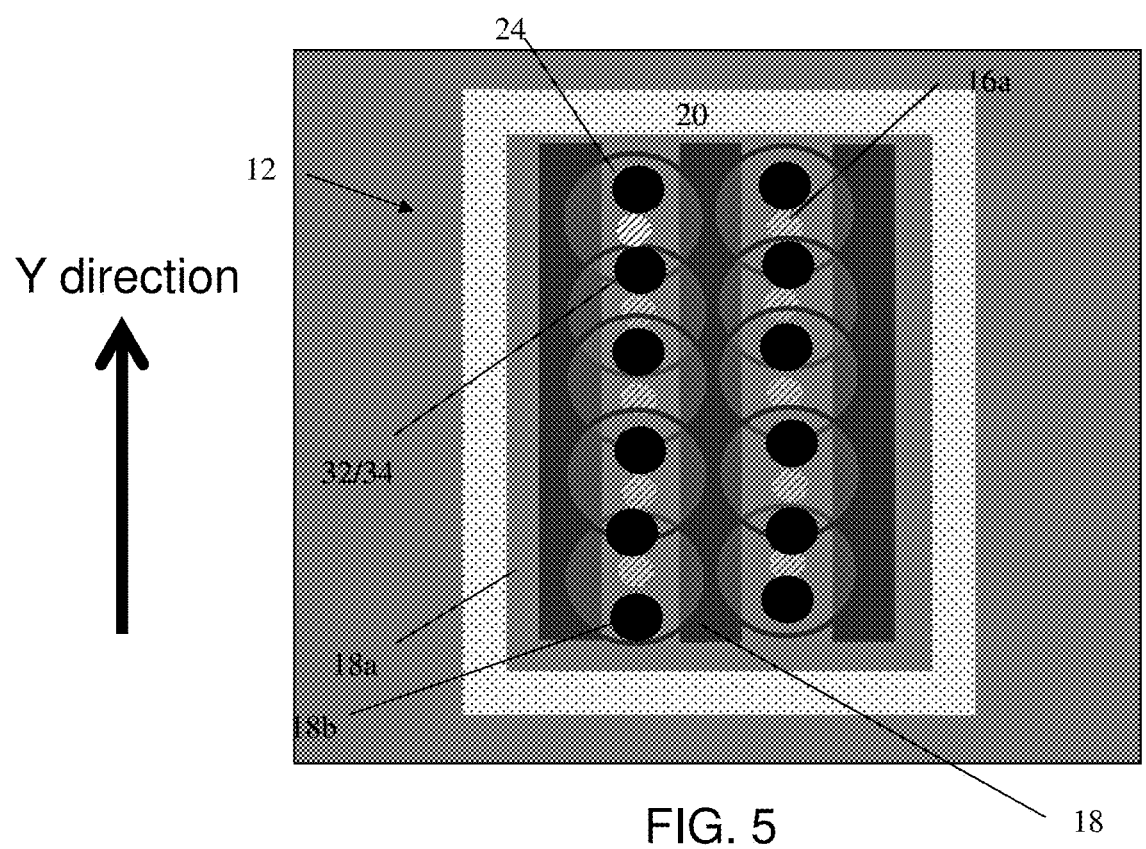
FIG. 5 shows another representative partial top view of the structures of FIGS. 1-4C in accordance with aspects of the present disclosure.

In embodiments, for example, the deep trench isolation structures 20 will surround transistors 18 (see, e.g., the top view shown in FIG. 5). The deep trench isolation structures 20 isolate the implanted well regions (not shown) from adjacent well regions, e.g., FET source/drain junctions in n-well and p-well regions; or triple well junction regions, and will also prevent well to substrate depletion regions from merging thereby reducing harmonics. Accordingly, by providing the deep trench isolation structures 20 it is possible to reduce harmonics, improve leakage currents, and reduce noise on high resistivity bulk substrates.

Figure 2D:
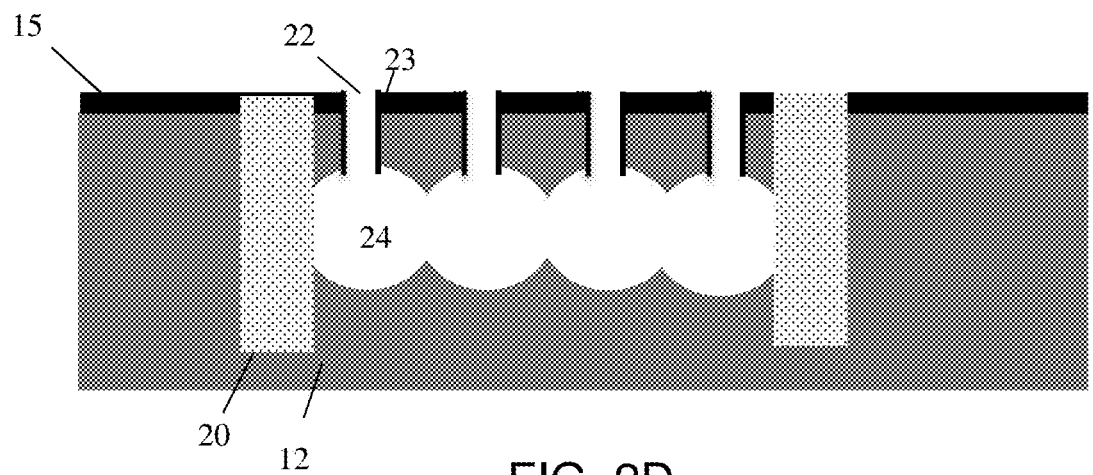

FIG. 2D shows the case where the deep trench isolation structures 20 surround the FET and have airgaps 24 merged under a FET (see, e.g., FIG. 3) touching the deep trenches 20. In this embodiment, the deep trenches 20 provide mechanical support for the airgap 24 and the transistors above the airgap are completely isolated from the substrate 12 with the airgap extending fully to the edges of isolation structures 20.

Figure 2E:
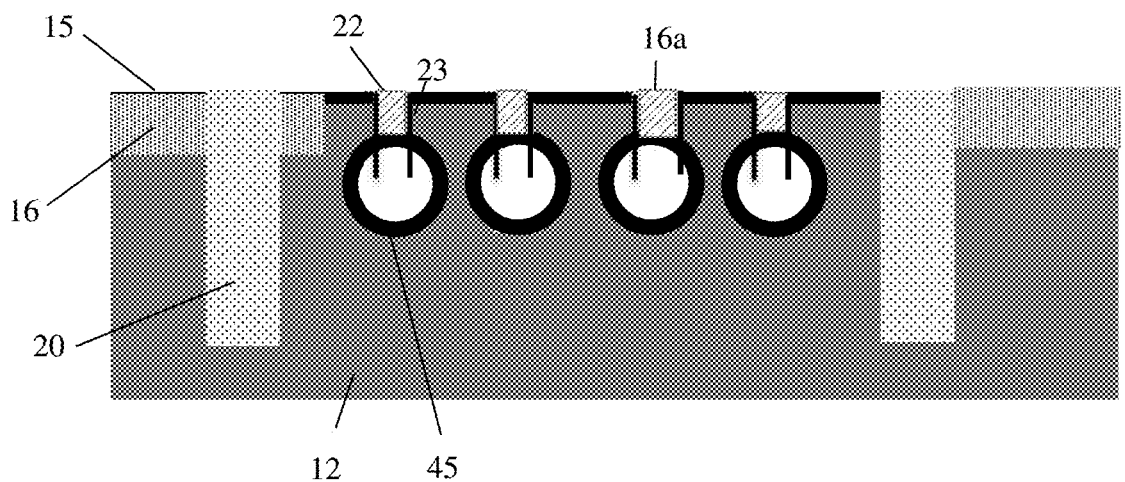

In FIG. 2E, shallow trench isolation (STI) structures 16 are formed in the substrate 12. In embodiments, the STI structures 16 can be composed of oxide material, as an example, and can be formed using conventional lithography, etching and deposition steps, followed by a chemical mechanical polishing (CMP) step. In embodiments, the STI structures 16 can be formed prior to the formation of transistors, and can have a depth of about 0.3 μm; although other depths are also contemplated herein. In further embodiments, the deep trench isolation structures 20 can be formed before or after the STI structures 20, before or after the FET's, and preferably beyond a depth of the p-well region 14. In embodiments, the STI structures 16 can extend to both, one, or no sides of the deep trench isolation structures 20.

During the deposition of the oxide or other insulator material for the STI structures 16 or the deep trench isolation structures 20, oxide material (or other insulator material) 16a will cap or plug the top of the trenches 22, e.g., close the airgap structures 24, to prevent moisture from entering into the airgap structures 24 during subsequent processes.

The airgaps 24 in FIG. 2E are shown with their top regions 22 filled and sidewalls of the airgap 24 partially coated with dielectric 45 on their surface. This dielectric coating 45 could consist of one or more of a thermal oxidization or CVD oxide deposition either separate from or the same as the ones used to fill the shallow trench isolation trenches 16; or could be formed separately from the shallow trench isolation 16 oxide fill.

As further shown in FIG. 2F, a depth of the deep trench 20 is below the p-well region 14 and, more preferably, can be 30 μm or greater, e.g., about 20 μm to about 100 μm, so that depletion regions from wells in the substrate are kept inside the region surrounded by the deep trench isolation. In further embodiments, the deep trench isolation structures 20 can be formed to a backside grind interface of the substrate 12 to completely isolate adjacent well regions and the RF devices from DC substrate currents. The diameter or width of the deep trench can be about 1 μm; although other dimensions are also contemplated herein depending on the technology node, amongst other factors.

Figure 2F:
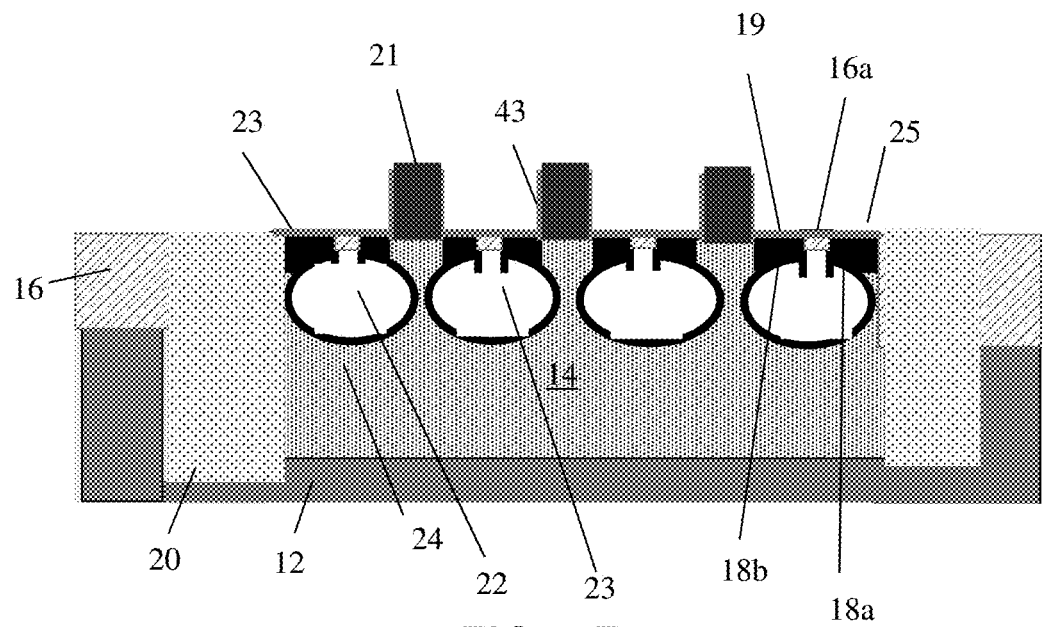

FIG. 2F shows a multifinger NFET switch. If a PFET switch was shown, then the well and source/drain doping polarites would be swapped, as known in the art. The NFET switch well 14 and source/drain region 19, NFET gate conductor 21, optional poly gate spacer 43, and silicide 25 are shown. The source/drain region 19 may contain the transistor p-type halo, n-type extension implants, and n-type source/drain implants as known in the art. The n-type source/drain region 21 intercepts the airgap 24 such that the pn junction area between the n-type source/drain and p-type p-well of the transistor is reduced. This reduction in the source/drain junction area will reduce the junction capacitance. Since the junction capacitance is non-linear with voltage, this reduction will improve the transistor linearity.

In embodiments, the transistors 18 can be active RF devices, e.g., RF switches, or other active or passive devices, that are provided with a bias that is different than the substrate bias. The transistors 18 can be formed on top of the substrate, e.g., substrate material (Si) remains under the transistors 18 (e.g., FET gate). The transistors 18 can be formed using multiple gates in an array of alternating source/drain/source/drain/, etc. configuration, as is known in the art. In embodiments, the spacing between the multi-fingers, e.g., transistor gates wired in parallels 18, can be about than 600 nm; although other dimensions are contemplated depending on the technology node. In addition, multiple stacks of multi-finger transistors can be placed, as known in the art. The transistors can have body contacts formed inside the ring of deep trench isolation 20 shown in FIG. 5 formed using any standard device layout as known in the art.

As should also be understood by those of ordinary skill in the art, the transistors 18 can be formed by conventional CMOS processes including deposition of gate dielectrics (e.g., high-k dielectrics such as Hafnium oxide, etc.), followed by gate metals (e.g., different work function metals), patterning of the materials using lithography and etching (e.g., reactive ion etching (RIE) to form the gate stacks, followed by sidewall formation, e.g., oxide or nitride materials deposited on the gate stacks). Source regions 18a and drain regions 18b are formed within the substrate 12 (well region 14) or on the substrate 12 over the well region 14 (e.g., for raised source and drain regions) using conventional dopant or ion implantation processes such that no further explanation is required. In embodiments, an epitaxial growth process can be used to form the raised source and drain regions. As shown, the airgap structures 24 are formed in the source/drain regions extending to a bottom of a PN junction under the transistors 18, e.g., touching the source/drain regions 18a, 18b.

As shown in FIG. 2F, silicide 25 are formed on the source regions 18a and drain regions 18b and over the airgap structures 24. In embodiments, the silicide process begins with deposition of a thin transition metal layer, e.g., nickel, cobalt or titanium, over fully formed and patterned semiconductor devices (e.g., doped or ion implanted source and drain regions 18a, 18b and respective devices 18). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 26 in the active regions of the devices, e.g., transistors 18 shown in FIG. 3. Silicide 25 is shown bridging across the oxide sealed airgap trench 16a but could also not bridge across this oxide filled gap (not shown). In either case, the subsequently formed contacts 32 will touch this silicided region 25 to make contact to the source/drain of the FET.

Figure 3:
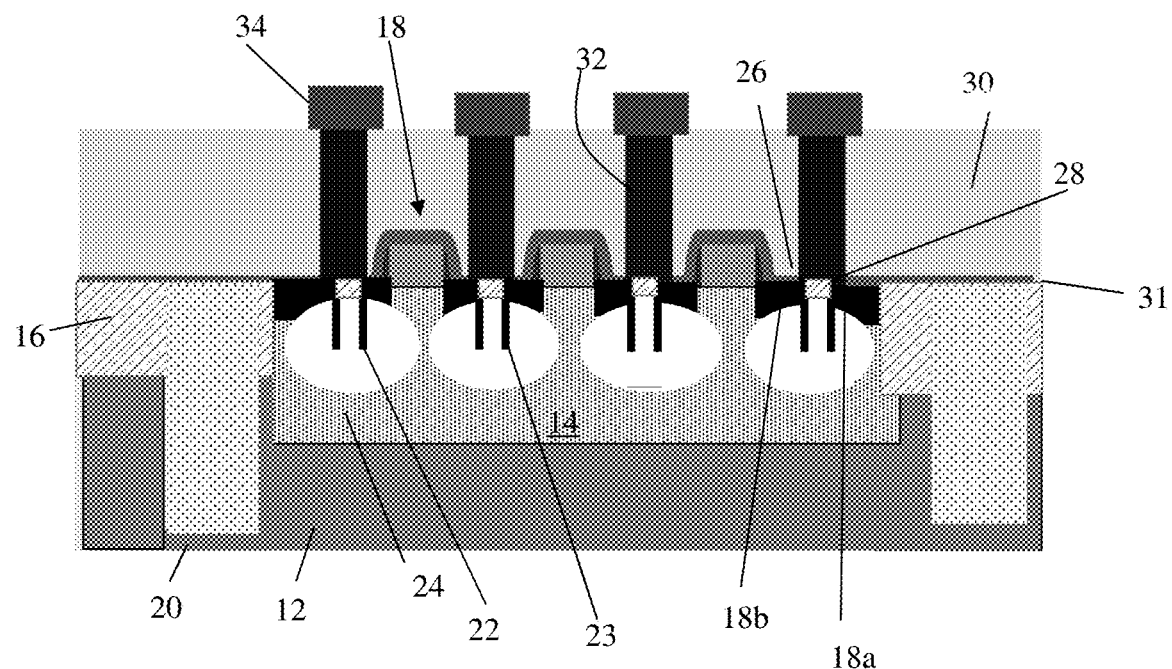
FIG. 3 shows gate structures between the airgap structures of FIG. 2, amongst other features, and respective fabrication processes in accordance with aspects of the present disclosure.

In FIG. 3, a barrier dielectric layer 31 can be formed over the silicide 26 in the active regions of the devices, e.g., transistors 18. The barrier layer 28 can be a barrier nitride film deposited using a conventional deposition process, e.g., CVD process. An optional barrier dielectric 31 and an interlevel dielectric material 30 is formed over the exposed surfaces of the structure, e.g., over the transistors 18 and barrier layer 28. The optional barrier dielectric layer could be SiN, SiCN, etc. as is known in the art. The interlevel dielectric material 30 can be an oxide material such as $SiO_2$, phosphosilicon glass (PSG), boro-phospho silicon glass (BPSG), SiCOH, etc. deposited using any conventional deposition process, e.g., CVD. Contacts 32 are formed within the interlevel dielectric material 30 using conventional lithography, etching and deposition of metal or metal alloy processes. If the silicide 25 is not bridged across oxide 16a, then the contacts 32 have a width larger than the trenches 22 and will be in direct electrical contact with the silicide 26. Wiring layers and other back end of the line structures 34 are formed in contact with the contacts 32 using, again, conventional CMOS deposition and patterning processes.

Figure 4A:
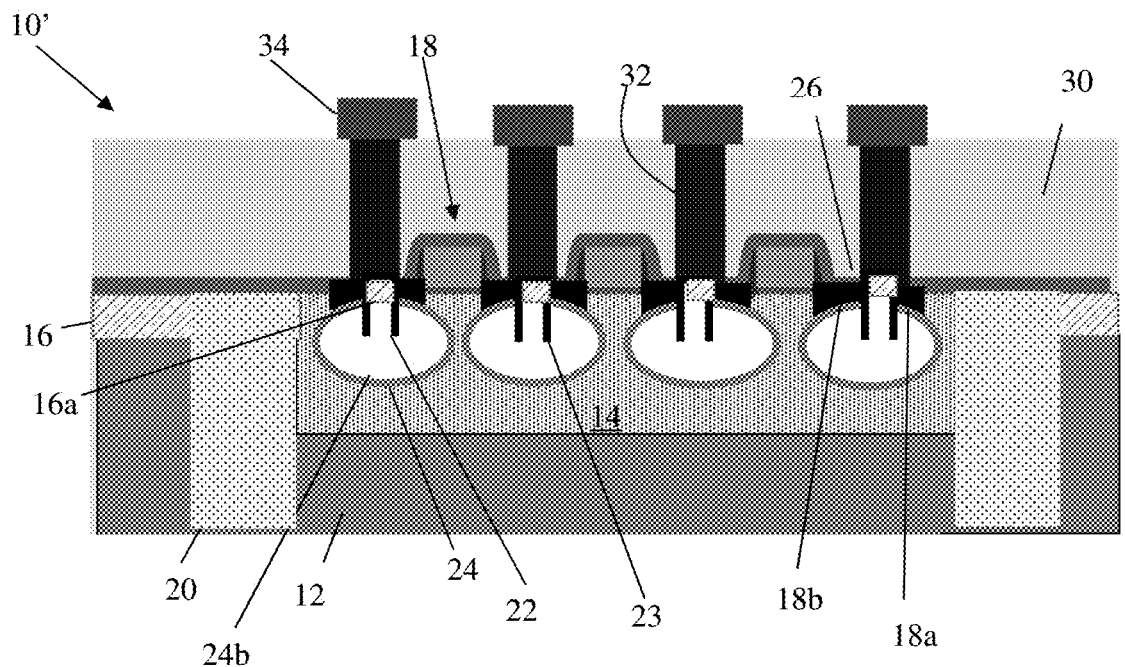
FIG. 4A shows lined airgap structures in a well structure, amongst other features, and respective fabrication processes in accordance with aspects of the present disclosure.
Figure 4B:
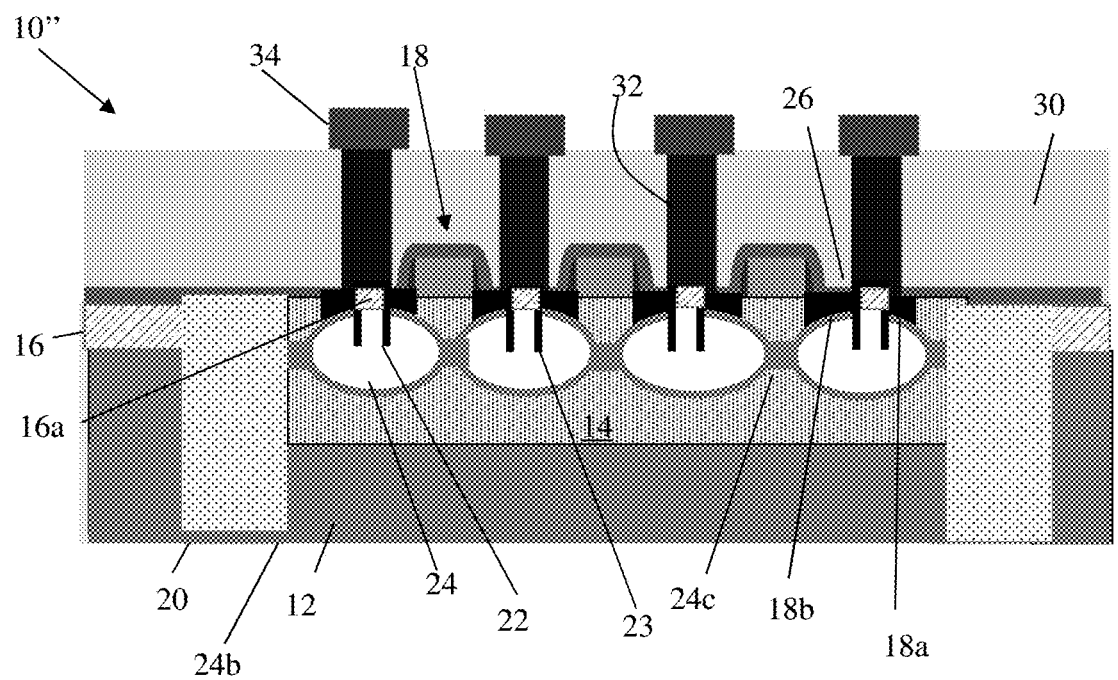
FIG. 4B shows merged lined airgap structures in a well structure, amongst other features, and respective fabrication processes in accordance with aspects of the present disclosure.
Figure 4C:
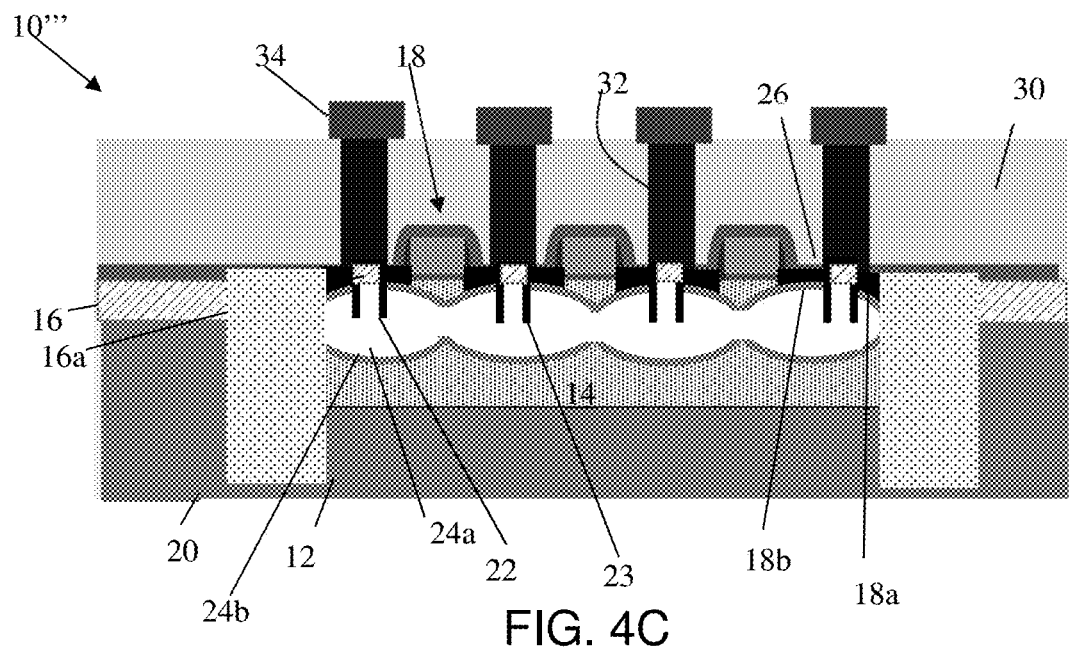
FIG. 4C shows a single lined airgap structure in a well structure, amongst other features, and respective fabrication processes in accordance with aspects of the present disclosure.

FIGS. 4A, 4B and 4C show additional structures and respective fabrication processes in accordance with additional aspects of the present disclosure. More specifically, the structure 10' shown in FIG. 4A includes the structures and materials described in FIG. 1, in addition to the airgap structures 24 having insulated, e.g., oxidized, sidewalls 24b. As shown in FIG. 4B, in the structure 10", the oxidized sidewalls 24b merge together with adjacent airgap structures 24 as represented by reference numeral 24c including touching or merging with the deep trench oxide isolation 20. The combination of airgap 24 and the oxidized regions 24c provide isolation of the FET from the substrate. Effectively, the isolated FET is similar to a FET formed on a SOI substrate, which is also isolated from the substrate.

As shown in FIG. 4C, in the structure 10''', a single airgap structure 24a with insulated, e.g., oxidized, sidewalls 24b are shown formed under the transistors 18 in the p-well 16. The sidewalls can be oxidized using any conventional thermal oxidation process. And, as should be understood by those of skill in the art that all of these structures can be representative of a triple well stack, which eliminates the need for the deep trench isolation structures.

It should be recognized that the structures of FIGS. 1A-4C can be a multiple stack FET containing a plurality of gate structures (transistors) 18 forming a multi-finger FET as known in the art, e.g., RF switches or other FETs, aligned in parallel. Source and drain regions 18a, 18b are provided between the plurality of transistors 18. It should further be understood that multiple layouts shown in FIGS. 1A-4C can be provided, with a deep trench isolation structures 28 shared amongst upper and lower of the plurality of transistors 18 separating the transistor stacks.

FIG. 5 shows another representative partial top view of the structures of FIG. 4A and similar figures in accordance with aspects of the present disclosure. As shown in FIG. 5, the airgap structures 24 can merge together along the Y directions of the structure. In particular, FIG. 5 shows the airgaps merging vertically in parallel with the FET gate. By merging the airgaps vertically in parallel with the FET gate, the source/drain junction area is substantially reduced. Accordingly, a continuous airgap structure along the longitudinal fin direction, e.g. parallel to the FET gates, can be formed by the processes described herein. As further shown in this partial view, insulator material 16a will plug the trenches or airgap vias 22. Contacts 32, 34 are also extending to the substrate 12 to bias the substrate shown, in this case, not intersecting the airgap trenches 16a. For the merged airgaps shown in FIG. 2D, the airgap would extend in FIG. 5 in the x- and y-direction, extending in both cases to the deep trench isolations 20. In this case, the deep trench isolations 20 would provide mechanical support to hold up the released silicon and FET's.

In this embodiment, the contacts 32, 34 are staggered to not be coincident with the airgap vias 22. Alternatively, the contacts 32, 34 could be partially or wholly coincident with the airgap vias 22 if the contacts have a larger width or diameter than the airgap vias 22 to allow for current flow into the FET source/drain. In embodiments (not shown), the contacts 32, 34 could be designed as bars and not holes; and the airgap vias 22 could be formed from bars, not holes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming a plurality of trenches into a well region of a substrate;
    lining the plurality of trenches with insulator material;
    forming at least one airgap structure extending from the plurality of trenches within the well region by etching the substrate through the plurality of trenches; and
    forming a deep trench structure in the substrate beyond a maximum depletion depth, the deep trench structure being formed by etching into the substrate to form a trench and depositing dielectric material and polysilicon into the trench.

2. The method of claim 1, wherein the at least one airgap is lined with oxide material.

3. The method of claim 1, wherein the substrate is a high resistivity substrate.

4. The method of claim 1, wherein the at least one airgap structure is formed between adjacent gate structures.

5. The method of claim 1, wherein the at least one airgap structure is formed as a single airgap under multiple gate structures, extending from the plurality of trenches.

6. The method of claim 1, further comprising plugging the at least one airgap structure with the insulator material.

7. The method of claim 1, wherein the lining of the plurality of trenches comprises depositing dielectric material on sidewalls of the plurality of the trenches and on a surface of the substrate and anisotropically etching the dielectric material from the surface of the substrate.

8. The method of claim 7, wherein the lining is deposited to a thickness that does not pinch off an opening of the plurality of trenches.

9. The method of claim 1, wherein the at least one airgap structure is formed by an etching process at a bottom of the plurality of the trenches, with the lining protecting the sidewalls of the plurality of the trenches.

10. The method of claim 1, wherein the at least one airgap structure is formed by vertically directional ion bombardment through the plurality of the trenches.

11. The method of claim 1, further comprising coating the at least one airgap with dielectric using one or more thermal oxidization process or chemical vapor oxide deposition process.

12. The method of claim 1, wherein the at least one airgap is plural airgaps formed by separating a single airgap with insulating material.

13. The method of claim 12, wherein the single airgap is separated by oxidizing sidewalls of the single airgap.

14. A method comprising:
   forming at least one gate structure located above a well region and comprising source/drain regions in the well region;
   forming a plurality of trenches extending from a surface of the well region and into the well region;
   forming at least one airgap structure under the source/drain regions of the at least one gate structure, the at least one airgap structure extending into the well region from the plurality of trenches;
   sealing the at least one airgap structure with the insulator material that is also plugging the plurality of trenches; and
   forming a deep trench isolation structure that surrounds the at least one airgap structure.

15. The method of claim 14, further comprising forming multiple airgap structures extending from multiple trenches, and merging the multiple airgap structures into a single airgap under multiple gate structures.

16. The method of claim 14, wherein the deep trench isolation structure surrounds and extends beyond the at least one airgap structure.

17. The method of claim 14, further comprising:
   forming multiple airgap structures extending from multiple trenches; and
   oxidizing sidewalls of the multiple airgap structures such that the oxidizing sidewalls merge together with adjacent airgap structures of the multiple airgap structures and contact the deep trench isolation structure.

18. The method of claim 14, further comprising forming shallow trench isolation structures and the deep trench isolation structure extending through the shallow trench isolation structures, both the shallow trench isolation structures and the deep trench isolation structure form a ring around the well region and the at least one gate structure.

19. A method comprising:
   forming at least one trench within a substrate;
   lining the at least one trench structure with insulator material;
   forming at least one airgap in the substrate through the at least one trench, the at least one airgap extending to a junction formed by source/drain regions of at least one gate structure;
   capping the at least one trench with insulator material to seal the at least one airgap;
   forming the at least one gate structure with the source/drain regions above the at least one airgap; and
   forming a deep trench isolation structure with dielectric material extending within the substrate and beyond the well region, the deep trench isolation structure surrounding the at least one airgap and the at least one gate structure.

20. The method of claim 19, further comprising forming a shallow trench isolation structure, wherein the deep trench isolation structure is formed through the shallow trench isolation structure.

* * * * *